United States Patent
Uppal et al.

(10) Patent No.: US 9,702,926 B2
(45) Date of Patent: Jul. 11, 2017

(54) METHODS, APPARATUS AND SYSTEM FOR SCREENING PROCESS SPLITS FOR TECHNOLOGY DEVELOPMENT

(71) Applicant: GLOBALFOUNDRIES Inc., Grand Cayman (KY)

(72) Inventors: Suresh Uppal, Clifton Park, NY (US); Andreas Kerber, Mount Kisco, NY (US); William McMahon, Scarsdale, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 594 days.

(21) Appl. No.: 14/288,278

(22) Filed: May 27, 2014

(65) Prior Publication Data

US 2015/0346271 A1 Dec. 3, 2015

(51) Int. Cl.
*G01R 31/26* (2014.01)
*G01R 31/12* (2006.01)

(52) U.S. Cl.
CPC ....... *G01R 31/2642* (2013.01); *G01R 31/129* (2013.01); *G01R 31/2623* (2013.01)

(58) Field of Classification Search
CPC .......... G01R 31/14; G01R 31/129; G01R 31/2623–31/2642; G01R 31/2879
USPC ........... 324/750.01–765.01; 702/34, 58, 117, 702/182, 186
See application file for complete search history.

(56) References Cited

U.S. PATENT DOCUMENTS 8,587,383 B2 * 11/2013 Brochu, Jr. ........ G01R 31/2824 324/750.3

* cited by examiner

*Primary Examiner* — Melissa Koval
*Assistant Examiner* — Rahul Maini
(74) *Attorney, Agent, or Firm* — Williams, Morgan, P.C.

(57) ABSTRACT

At least one method and system disclosed herein involves performing a time-dependent dielectric breakdown (TDDB) test and a bias temperature instability (BTI) test on a device. A device having at least one transistor and at least one dielectric layer is provided. A test signal is provided for performing a TDDB test and a BTI test on the device. The TDDB test and the BTI test are performed substantially simultaneously on the device based upon the test signal. The data relating to a breakdown of the dielectric layer and at least one characteristic of the transistor based upon the TDDB test and the BTI test is acquired, stored, and/or transmitted.

20 Claims, 7 Drawing Sheets

METHODS, APPARATUS AND SYSTEM FOR SCREENING PROCESS SPLITS FOR TECHNOLOGY DEVELOPMENT

BACKGROUND OF THE INVENTION

1. Field of the Invention

Generally, the present disclosure relates to the manufacture of sophisticated semiconductor devices, and, more specifically, to various methods of testing integrated circuits to determine the effects of various processes upon the reliability of the circuits.

2. Description of the Related Art

The fabrication of advanced integrated circuits, such as CPU's, storage devices, ASIC's (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS and as well as metal insulator semiconductor (MIS) technologies are currently among the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. Generally, MOS technology involves forming a poly/metal gate, as well as dielectric and semiconductor substrates.

Various processes are performed on semiconductor substrates in manufacturing integrated circuit products. When integrated circuits are formed, tests are performed to determine the correctness in the operation of the circuits. Manufacturers generally perform various tests to determine the effects of the various processes on the performance and reliability of the circuits. Various quality or performance criterions may be used in determining whether the integrated circuits meet quality standards.

Dielectric weakening and/or failure with respect to time, temperature, and/or voltage are major concerns with regard to reliability failure of circuits manufactured using current semiconductor technology. In some instances, defects during processing can lead to dielectric failure (e.g., time dependent dielectric breakdown (TDDB) failure mechanism), or a parametric shift known as bias temperature instability (BTI) failure mechanism, either of which may result in a decrease in the overall reliability of the semiconductor devices. Process problems may affect the characteristics of the transistors and/or may cause weakening or failure of dielectric, which may lead to problems such as loss of integrity of the gate of a transistor. Therefore, tests to check various failure mechanisms (TDDB/BTI) are performed for testing the reliability of the integrated circuits.

Manufacturers generally perform tests that help determine the dielectric failure prospects in order to determine the reliability of the circuits. Generally, two primary tests are performed in order to determine the dielectric failure prospects: a TBDD test and a BTI test. Generally, these tests are performed individually on different devices.

The TDDB test relates to determining when a circuit portion, such as the gate of a MOSFET device, breaks down. This may be caused by weakness in portions of the dielectric. A determination may be made as to when the dielectric part of the circuit portion breaks down at certain particular current-levels, voltage levels, and/or temperature levels. In the example of a MOSFET, the breakdown would keep the gate of the MOSFET from operating properly as a switch that could control the current flow through the source and the drain of the MOSFET.

The BTI test relates to determining a shift in linear and saturation threshold voltages and/or linear and saturation currents, for example, of a transistor. In some cases, due to contamination during process, or due to other process problems, the threshold voltage may shift to a higher voltage. In this case, a higher voltage would be required to turn on, for example, a gate of a transistor. In addition, with continuous usage of a product (i.e., integrated chip), the MOSFET device may suffer degradation of its characteristics (e.g., threshold voltage, linear current, saturation current, etc.) due to time, temperature and/or voltages, etc. The BTI test may reveal whether the amount of shift (at time zero or within the lifetime of the product) in the linear and saturation threshold voltages, linear current, and/or saturation current would cause operational problems in a component, such as a transistor.

A voltage ramp Stress (VRS) test may be used to perform the TDDB and BTI tests. FIG. 1 illustrates a prior art VRS test signal used for a TDDB test and/or a BIT test. As indicated in FIG. 1, the stress voltage is supplied to the gate and/or substrate while other terminals are grounded, wherein the stress voltage is ramped up in steps. The steps are characterized by a change in voltage of $\Delta V$ during a time period of $\Delta T$. The signal in FIG. 1 contains intermediate monitoring steps for verification of dielectric breakdown. The dielectric breakdown may be determined from monitoring current and/or stress current.

As an example, in processes involving metal-gate/High-k stack (MG/HK), fast process screening is important due to the introduction of new materials, resulting in enhanced process complexity and generating new instability such as the positive-bias temperature instabilities. Tests using VRS signals may also be used to assess dielectric breakdown for conventional ultrathin SiON gate dielectrics with poly-Si electrodes.

FIG. 2 illustrates a prior art VRS test signal used for a BTI test. FIG. 2 illustrates two graphs (202 and 204). Graph 202 plots a stress voltage signal 230 applied to the gate of a transistor, with respect to time. Graph 204 illustrates the corresponding drain voltage ($V_D$) or source voltage ($V_S$) during that time. Graph 202 shows a voltage applied to the gate in a step-wise manner, increasing up to the pre-step 210 level. Prior to starting the stress voltage, a reference drain current ($I_{Id}$) and a reference gate current ($I_{Ig}$) are measured. These reference currents (before and after the stress cycles) may be compared to actual sensed currents in order to check the threshold and/or saturation current integrity.

At the start time $t_{start}$, a stress voltage is provided to the gate, wherein the value of the stress voltage is above the gate sense voltage ($V_{G\_sense}$). The application of the stress voltage is brought back to the $V_{G\_sense}$ level for performing the sensing function. Subsequently, a stepped-up stress voltage is applied, followed by bringing the stress voltage back to the $V_{G\_sense}$ level. This stepwise increase is repeated until a pre-defined voltage, $V_{stop}$, a predetermined amount of parametric shift, or stop time, $t_{stop}$. The stress voltage signal 230 rises in steps 220. The time period of the stress voltage applied at each step is stress time ($t_{stress}$) 240. The time period of the sensing function, wherein the stress voltage is brought down to the $V_{G\_sense}$ is the sense time ($t_{sense}$) 250. Based upon performing the stress and sense function, the shift in the threshold voltage, linear current, and/or saturation current of a transistor may be determined. Moreover, there may be variants for the drain voltage, i.e., various levels of the drain voltage, wherein the drain voltage may be in provided in steps or in a continuous mode.

FIG. 3 illustrates a flowchart depiction of a prior art process flow for manufacturing and testing semiconductor devices. Integrated circuits are formed on a substrate using a semiconductor manufacturing process (block 110). Various processes are performed on semiconductor substrates in manufacturing integrated circuit products. For example, photolithography, etching, chemical-mechanical polishing (CMP), etc., are some of the processes performed in manufacturing integrated circuit products.

At least a portion of the integrated circuits may be tested in order to determine the effects of processes upon reliability of circuits and/or test structure (block 120). Generally, in state-of-the-art manufacturing of integrated circuits, the tests may include performing a TDDB test on a device (block 122). Upon performing the TDDB test, data relating to the TDDB test is sensed. Moreover, a BTI test may be performed on another device (block 126). Upon performing the BTI test, data relating to the BTI test is sensed (block 128). In this manner, the state-of-the-art manufacturing processes call for performing the TDDB test and the BTI test in a sequential/individual manner on separate devices.

A determination may then be made as to whether the effects of the processes had on the reliability of the integrated circuits are acceptable, based upon the TDDB and the BTI tests (block 130). Upon a determination that the effects that the processes had upon the reliability of the integrated circuits are not acceptable based upon the tests, various modifications to process parameters may be made in order to adjust process steps performed when manufacturing the integrated circuits (block 140). Upon modifying process parameters, additional integrated circuits are formed on substrates and subsequent tests may be performed, as indicated in FIG. 1.

Upon a determination that the process effects upon the reliability of the integrated circuits are acceptable based upon the tests, a certification may be made that the test results are acceptable (block 150). Based upon this certification, manufacturing of the integrated circuits of the existing process parameters may be continued (block 160).

Among the disadvantages of state-of-the-art techniques, which call for performing the tests separately, and on different devices, includes the fact that performing these tests sequentially means that test information from the same device is not received. Other disadvantages include the fact that more time is required when the tests are performed due to the sequential nature of applying the TDDB and BTI tests. This causes a lack of cross-referencing of the test data from both the TDDB and the BTI tests for more efficient cycle. Further, the learning cycle of forming circuits, testing the circuits, providing feedback adjustments, and/or addressing process splits relating different process sets may be made more inefficient using state-of-the-art methodologies.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for performing a time-dependent dielectric breakdown (TDDB) test and a bias temperature instability (BTI) test on a device. A device having at least one transistor and at least one dielectric layer is provided. A test signal is provided for performing a TDDB test and a BTI test on the device. The TDDB test and the BTI test are performed substantially simultaneously on the device based upon the test signal. The data relating to a breakdown of the dielectric layer and at least one characteristic of the transistor based upon the TDDB test and the BTI test is acquired, stored, and/or transmitted.

BRIEF DESCRIPTION OF THE DRAWINGS

The disclosure may be understood by reference to the following description taken in conjunction with the accompanying drawings, in which like reference numerals identify like elements, and in which.

Figure 1:
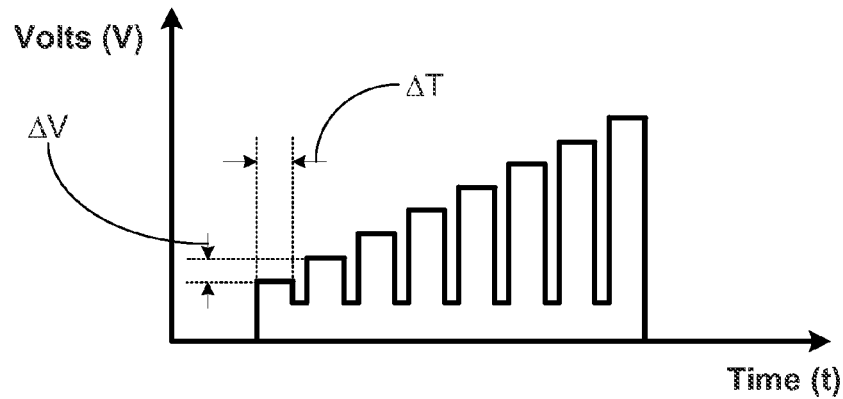
FIG. 1 depicts one illustrative example of a prior art VRS signal used for voltage breakdown test.
Figure 2:
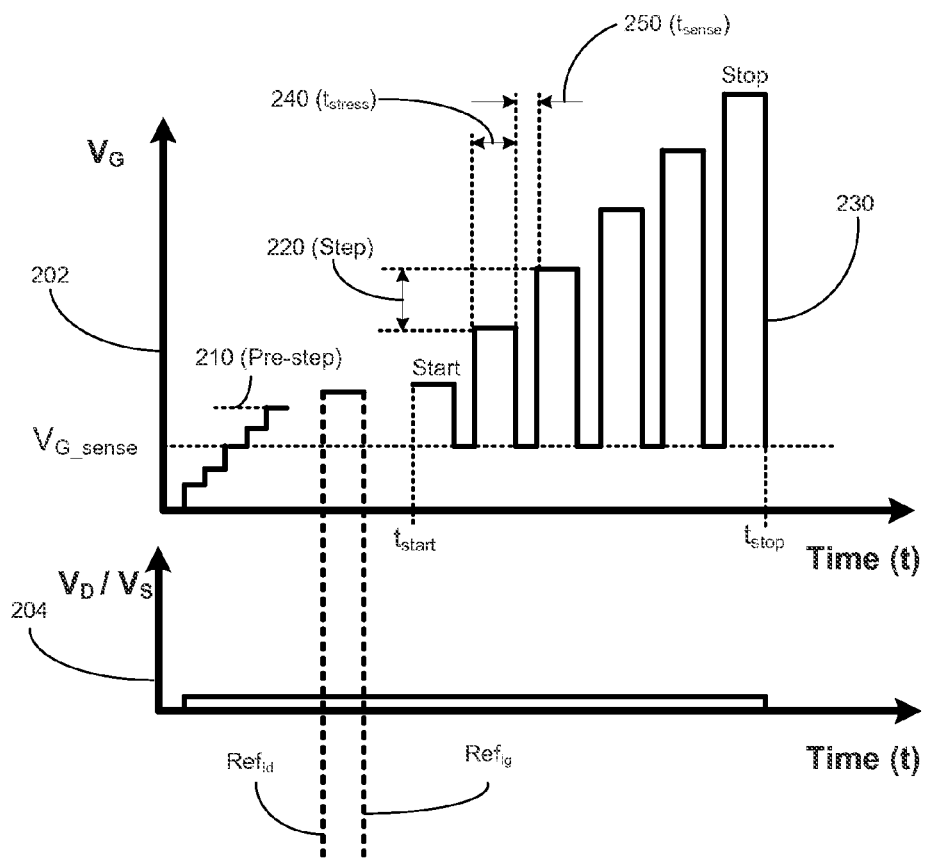
FIG. 2 depicts one illustrative example of a prior art VRS signal used for threshold integrity test.
Figure 3:
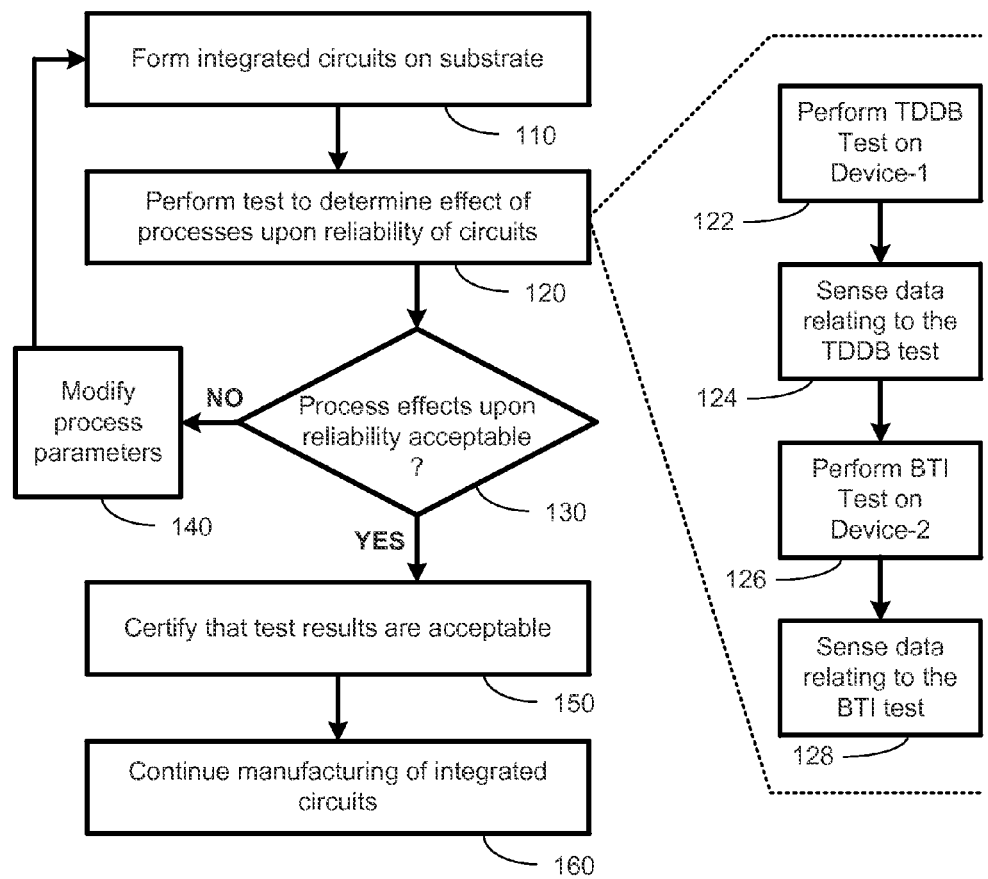
FIG. 3 depicts illustrates a flowchart depiction of a prior art process flow for manufacturing and testing semiconductor devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for performing a reliability test upon integrated circuits manufactured by a semiconductor device processing system. The processing output, i.e., the integrated circuits/devices, may be tested for reliability and operational integrity. Results of these tests may be used in a learning cycle, which includes analyzing test data, and providing feedback for adjustments in the processing of the integrated circuits, determining a process split between a plurality of process sets, etc.

In some instances, integrated circuits may contain characteristics that may lead to weakness of the dielectric leading to TDDB failure, or may lead to a change in parametrics, leading to BTI failure mechanism. Embodiments herein provide for performing a test that would provide data indicative of the TDDB and the BTI characteristics of integrated circuits. Embodiments herein provide for performing TDDB testing and BTI testing together on the same device or circuit. Therefore, this unified single test may be used for determining the transistor characteristics of an integrated circuit, as well as the gate integrity of transistors, i.e., at which the dielectric becomes weak and fails.

Embodiments herein provide for receiving information as to the transistor characteristics, as well as the gate integrity at the same time from the same device. Therefore, cross-correlation of information from the TDDB and the BTI tests may be used to perform adjustments to one or more processing steps in the manufacturing of semiconductor devices.

Further, multiple process sets (e.g., a $1^{st}$ process set, a $2^{nd}$ process set, etc.) may provide different sets of integrated circuits/devices. Each process set may comprise a plurality of processing steps, e.g., photolithography process, etch process, CMP process, etc. The integrated circuits manufactured using these process sets may be tested using embodiments herein, performing the TDDB and the BTI tests together on the same devices. Since embodiments herein provides for performing the TDDB and the BTI tests substantially simultaneously on a single device, after testing multiple devices from different process sets, a learning cycle may be provided for selecting a preferred process step. The learning cycle may also provide for making adjustments to subsequent processes steps within one or more process sets. For example, based upon information from the TDDB and the BTI tests provided by embodiments herein, adjustments to parameters that control various processes, such as photolithography processes CMP processes, etch processes, etc., may be made. Embodiments herein provide for a more efficient test of processed semiconductor devices, a faster test from performing multiple test TDDB and BTI tests substantially simultaneously, and a shorter learning cycle for performing process adjustments or for selections of preferred process sets.

In one embodiment, the TDDB test results may be derived by performing a VRS test and measuring voltage breakdown (VBD) parameters. As described in further details below, a VRS signal may be applied as a stress signal, the results of which may be indicative of a voltage breakdown, as well as a time-dependent breakdown, which may be determined using the sensed VBD test parameters as well as other parameters, such as stress and sense time periods. In this manner, a TDDB test may be performed using a VRS signal.

Figure 4:
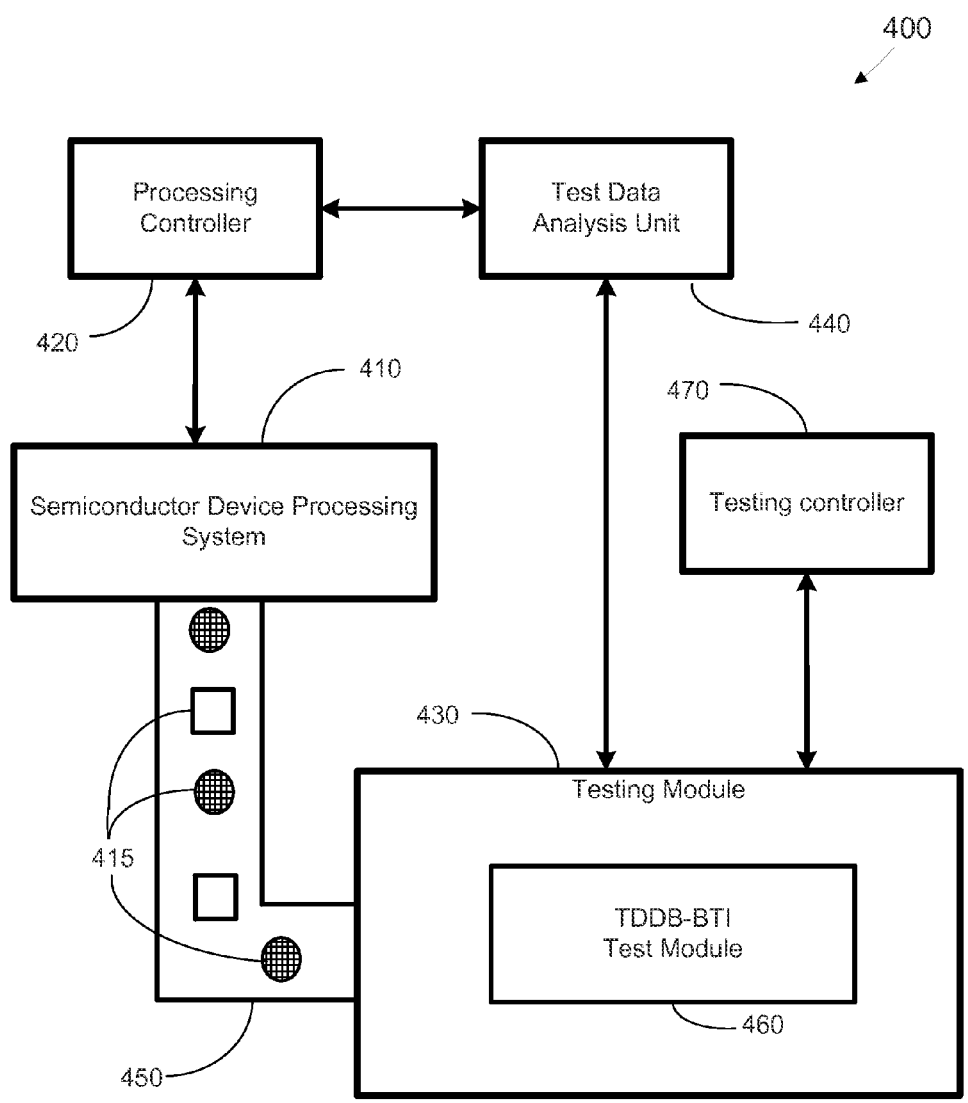
FIG. 4 illustrates a stylized block diagram depiction of a manufacturing and testing system, in accordance with some embodiments herein.

Turning now to FIG. 4, a stylized block diagram depiction of a system in accordance with some embodiments herein, is illustrated. The system 400 may comprise a semiconductor device processing system 410. The semiconductor device processing system 410 may comprise various processing stations, such as etch process stations, photolithography process stations, CMP process stations, etc. One or more of the processing steps performed by the processing system 410 may be controlled by the processing controller 420. The processing controller 420 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 410 may produce integrated circuits on a medium, such as silicon wafers. The processing system 410 may provide processed integrated circuits/devices 415 on a transport mechanism 450, such as a conveyor system. In some embodiments, the conveyor system may be sophisticated clean room transport systems that are capable of transporting semiconductor wafers. In one embodiment, the semiconductor device processing system 410 may comprise a plurality of processing sets. e.g., the $1^{st}$ process step, the $2^{nd}$ process set, etc., as described above.

In some embodiments, the items labeled "415" may represent individual wafers, and in other embodiments, the items 415 may represent a group of semiconductor wafers, e.g., a "lot" of semiconductor wafers. In some embodiments, the feedback provided by the testing module 430 may not be on an immediate, wafer-to-wafer basis, but may be based upon a lot-to-lot basis. The testing module 430 may also be capable of determining a change from one wafer to another within a lot. In many embodiments, the testing module provides test data that may be used by the processing controller 420 to modify one or more process parameters relating to a subsequent lot of semiconductor wafers.

The processed integrated circuits 415 may be provided to a testing module 430 for performing various tests. The integrated circuit/device 415 may comprise a plurality of transistors and at least one dielectric layer. In one embodiment, the dielectric layer may be comprised of silicon dioxide, silicon nitride, siliconoxynitride, or a material having a dielectric constant. The integrated circuit or device 415 may be a transistor, a capacitor, a resistor or a memory cell. In one embodiment, the device 415 is a transistor and the dielectric layer is a gate insulation layer for the transistor.

The testing module 430 may comprise a TDDB-BTI test module 460. In some embodiments, the testing module 430 may perform a voltage breakdown test (VBD), which may act as a proxy for the TDDB test, wherein, results from the VBD tests may be used to determine the TDDB results. The TDDB-BTI test module 460 is capable of performing a breakdown test and a BTI test substantially simultaneously upon a single integrated circuit/device. The TDDB-BTI test module 460 is capable of detecting various breakdown characteristics of the integrated circuit under test. The TDDB-BTI test module 460 is also capable of detecting various threshold shift characteristics of the integrated circuit under test. In one embodiment, the TDDB-BTI test module 460 is capable of providing test data relating to a breakdown of a dielectric layer of the device under test and/or at least one characteristic of a transistor of the device. The TDDB-BTI test module 460 may use test data in order to compare the degradation of the linear and saturation drain currents, as well as the linear and saturation threshold voltages, and/or other electrical parameters.

Test data from the TDDB-BTI test performed by the testing module 430 may be provided to the test data analysis unit 440. The test data analysis unit 440 may determine whether the breakdown data indicates that breakdown values are above a predetermined breakdown reference or threshold. Similarly, the test data analysis unit 440 may determine whether the shift in the threshold voltage(s) is not above a corresponding shift reference or threshold values. In one embodiment, these comparisons may be made using look-up functions involving stored data in the system 400 and/or comparison with off-line data. In other embodiments, the determinations with regard to the breakdown values and the threshold shift values may be based upon manual input from external sources.

The testing module 430 may be controlled by the testing controller 470. Although, in one embodiment, the testing controller 470 is depicted as being external to the testing module 430, in an alternative embodiment, the testing module 470 may be within the testing module 430. The testing controller 470 may be a workstation computer, a desktop computer, a laptop computer, a tablet computer, or any other type of computing device comprising one or more software products that are capable of controlling operations of the testing module 430.

Data from the testing module is received, processed, correlated, and/or stored by the test data analysis unit 440. Data from the test data analysis unit 440 may be provided to the processing controller 420. This data may be used by the processing controller 420 to perform adjustments to subsequent processes performed by the processing system 410, and/or provide information for selecting a particular process set based upon the test data results. In this manner, a feedback process may be performed based upon the learning cycle of the liability testing performed by the testing module 430. This feedback may affect various parameters used to perform processing of integrated circuits and/or selecting particular processes for manufacturing integrated circuits. For example, data from the test data analysis unit 440 may be provided to the processing controller 420. The processing controller 420 may then use this data to adjust one or more process parameters, and/or make a selection of a processing set from a plurality of processing sets. Examples of the process parameter may include, but are not limited to, a temperature, a pressure, a duration, a process gas composition, a process gas concentration, an applied voltage of a process operation, or the like.

The system 400 may be capable of performing analysis for various products involving various technologies. For example, the system 400 may provide test data for CMOS technology, Flash technology, BiCMOS technology, power devices, memory devices (e.g., DRAM devices), NAND memory devices, and/or various other semiconductor technologies.

Figure 5:
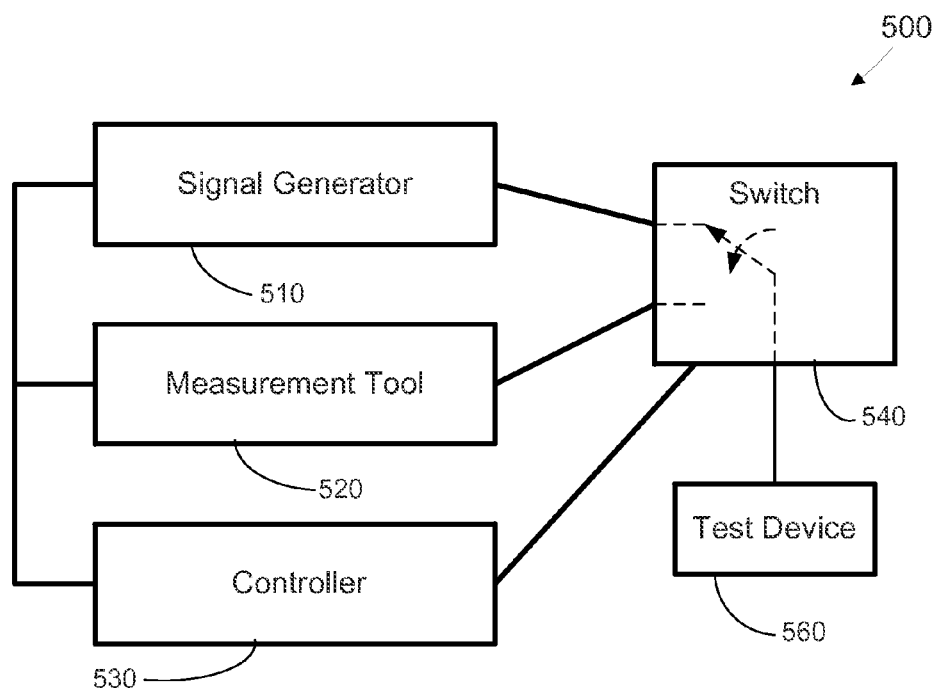
FIG. 5 provides a schematic depiction of an illustrative system that may be used in determining the reliability of dielectric layers.
Figure 6:
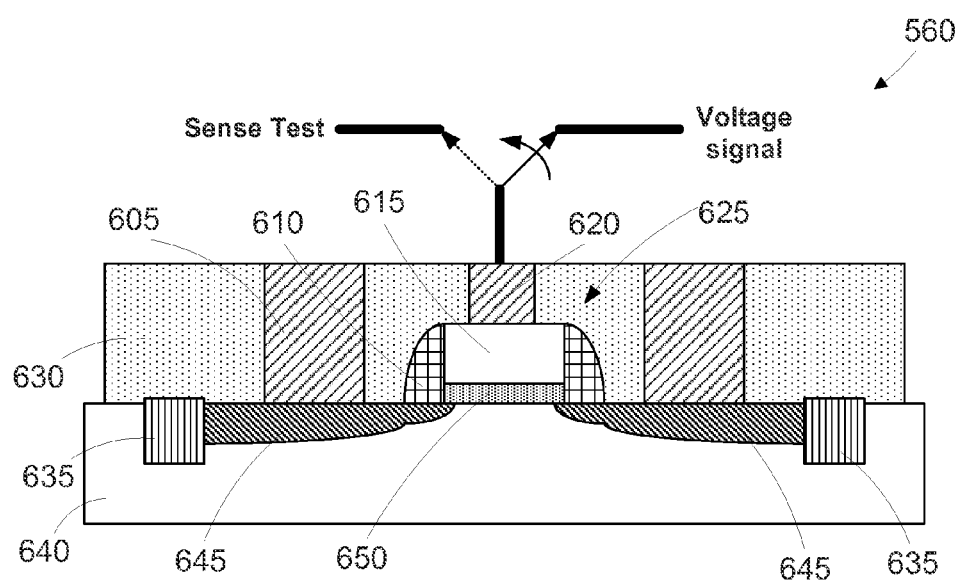
FIG. 6 depicts an enlarged view of an illustrative device that may be tested in accordance with the methodologies described herein.

FIG. 5 depicts an illustrative test system 500 that may be employed in accordance with the present invention to evaluate the reliability of dielectric layers. FIG. 6 depicts an illustrative test device 560 that may be subjected to the testing described herein using a testing test system 500 depicted in FIG. 5. In one embodiment, the testing test system 500 is a portion of the testing module 430. In general, the test system 500 is comprised of a signal generator 510, a measurement tool 520 (e.g., a stress-induced current and voltage measurement tool), a switch 540, and a controller 530. It should be understood that the test device 560 depicted in FIG. 5 is representative in nature of many such devices, e.g., hundreds or thousands, that may be subjected to such testing in order to acquire enough data to make reliable assessments regarding the reliability of the dielectric layers tested. Typically, the test device 560 is a test structure that is formed on a semiconducting substrate. e.g., an SOI substrate or a bulk silicon substrate. However, in some cases, it may be possible to perform the testing described herein on actual production devices, although modifications may have to be made due to the complexity of the completed devices.

The illustrative test device 560 depicted in FIG. 6 should also be understood to be representative in nature in that it may represent any of a variety of different types of semiconductor devices that employ dielectric layers. As shown herein, the illustrative test device 560 is a transistor comprised of a gate electrode 615, a dielectric layer 650, sidewall spacers 610 and source/drain regions 645. The test device 560 is formed above a semiconducting substrate 640 and it may be electrically isolated from other components by the trench isolation region 635 formed in the substrate 640. Also depicted in FIG. 6 is a layer of insulating material 630, source/drain contacts 605, and a gate contact 620.

The dielectric layer 650 may be comprised of a variety of materials, and it may be manufactured by a variety of techniques. Moreover, the thickness of the dielectric layer 650 may, in some cases, be less than or equal to or greater than 1.5 nm for modern high performance devices. For example, the dielectric layer 650 may be silicon dioxide, a layer of silicon dioxide with an enhanced concentration of nitrogen, or a so-called "high-k" dielectric material, i.e., a material having a dielectric constant greater than 5. In some cases, the dielectric layer 650 may be comprised of two or more separate layers that may be made of different materials. The dielectric layer 650 may be manufactured using a variety of known processing techniques, such as thermal growth processes, or by performing a variety of deposition processes, such as atomic layer deposition (ALD), chemical vapor deposition (CVD), plasma enhanced chemical vapor deposition (PECVD), spin-on deposition techniques, etc. Thus, the present invention should not be limited to any particular type of material for the dielectric layer or the manner in which such dielectric layers are made, unless such limitations are expressly set forth in the appended claims.

The signal generator 510 is capable of providing various voltage signals for performing the BTI and TDDB tests described herein. In one embodiment, the signal generator

510 may provide a voltage signal depicted in FIG. 8 and described below. That is, the signal generator 510 is capable of providing a set of ramping pulses as described below and illustrated in FIG. 8. Continuing referring to FIG. 5, in one embodiment, the signal generator 510 may be any of a variety of commercially available systems for generating such voltage signals. The magnitude of the voltage generated by the signal generator 510 may vary depending upon the application. With respect to current-day technology, wherein the operating voltage is on the order of approximately 1-2 volts, the signal generator 510 may generate signals having a voltage that ranges from approximately 4-5 volts. Note that the magnitude of the voltage pulses used in accordance with the present invention is typically higher than the voltage level applied during the constant voltage TDDB testing described in the background section of the application. Moreover, the width of the pulses generated by the signal generator 510 may also vary depending upon the particular application. In general, the width of the pulses will be less than 1 msec. Generally, the lesser the pulse width, the better the resolution of the testing techniques described herein. In one illustrative embodiment, the signal generator 510 may be configured to generate voltage pulses that have a pulse width of approximately 100 ns. The signal generator 510 is coupled to the gate electrode 615 of the transistor and the source and drain regions 645 are connected to the opposite terminal during the testing processes described herein.

The measurement tool 520 may any of a variety of commercially available devices that are capable of measuring the gate current, the drain/source current, the gate voltage, and/or the drain/source voltage of the test device 560. The measurement tool 520 is also coupled to the gate electrode 615. In general, the measurement tool 520 may be used to measure the gate current, i.e., the current flowing through the dielectric layer 650, after the dielectric layer 650 has been subjected to one or more of the voltage pulses generated by the signal generator 510. Typically, this may be accomplished by using the measurement tool 520 to apply a constant voltage, e.g., 1-2 volts, on the gate electrode 615 and to measure the gate current. This testing of the gate current is performed very quickly, e.g., on the order of one second for each test. In one particularly illustrative example, the measurement tool 520 may be used to measure the gate current for the test device 560 after each pulse generated by the signal generator 510. However, testing after every stress signal need not be required in all cases. For example, during the early portions of the test, when dielectric breakdown is less likely to occur, the measurement of the gate current may be made less frequently, e.g., after every fourth pulse. Thereafter, as the testing continues, the gate current may be tested more frequently to investigate the soft breakdown phenomenon described previously. Thus, the present invention should not be limited to any particular testing protocol unless such limitations are clearly set forth in the appended claims.

The controller 530 depicted in FIG. 5 controls the operation of the test system 500. To that end, the controller 530 operates the switch 540 between the signal generator 510 and the measurement tool 520 as necessary depending upon the particular testing methodology and protocol selected. For example, in the case where the gate current is measured after every pulse, the controller 530 flips the switch 540 between the signal generator 510 and the measurement tool 520 after predetermined time periods (e.g., after a stress time period), then back again (e.g., after a sense time period) to the signal generator 510 after the gate current, the gate voltage, and/or the drain current are measured by the measurement tool 520. That is, the switch 540 is capable of switching between a stress mode and a sensor mode when performing the TDDB-BTI testing. The signal generator 510 is capable of ramping up the voltage at each pulse. The testing mechanism described above is provided for illustrative purposes, and is but one example of a testing system that may be utilized in some embodiments herein.

Figure 7:
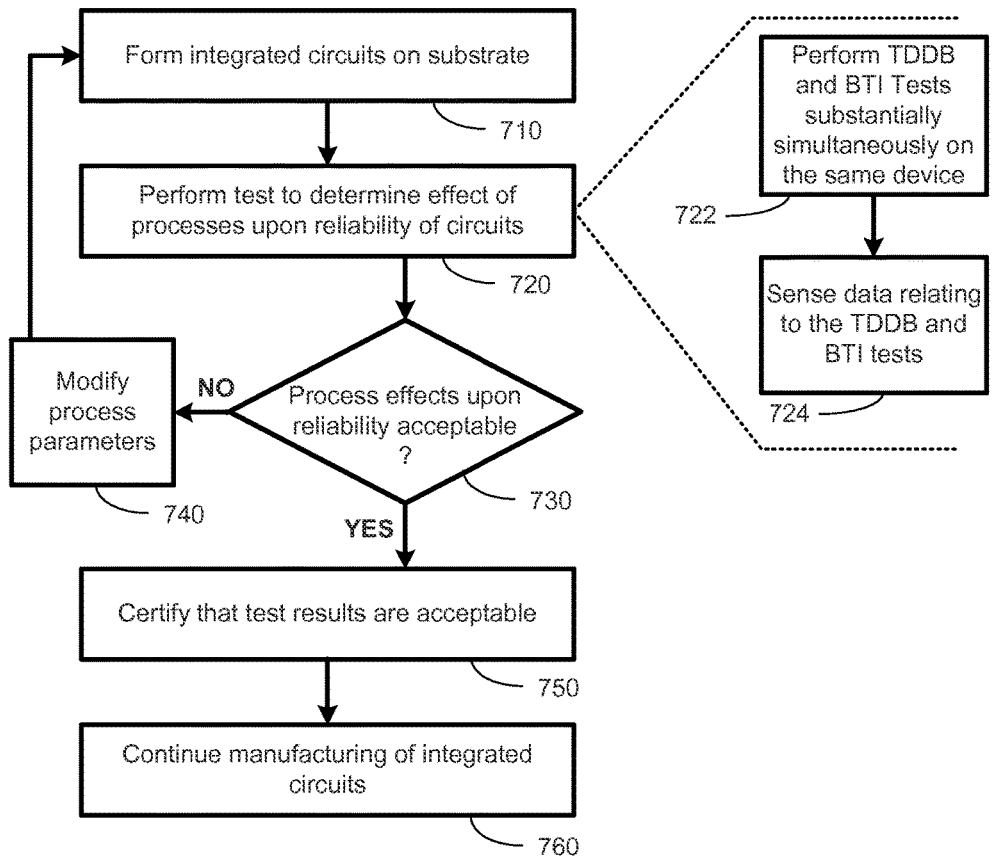
FIG. 7 depicts illustrates a flowchart depiction of a process flow for manufacturing and testing semiconductor devices, in accordance with some embodiments herein.

FIG. 7 illustrates a flowchart depiction of process flow for manufacturing and testing semiconductor devices, in accordance with some embodiments herein. Integrated circuit devices are formed on a substrate using a semiconductor manufacturing process (block 710). Various processes are performed on semiconductor substrates in manufacturing integrated circuit products. For example, photolithography, etching, chemical-mechanical polishing (CMP), etc., are some of the processes performed in manufacturing integrated circuit devices.

At least a portion of the device may be tested in order to determine the effects of processes upon reliability of circuits/test structure (block 720). In many cases the breakdown characteristics of various portions of the device may be tested. Further, the voltage threshold, (e.g., the voltage threshold for biasing the gate of a transistor) may also be tested. Therefore. TDDB and BTI tests may be performed on the devices.

Embodiments herein provide for the TDDB and BTI tests to be performed together on a single device (block 722). FIG. 8 illustrates a stylized depiction of implementing TDDB and BTI tests together, in accordance with some embodiments herein. FIG. 8 illustrates an exemplary voltage signal that may be used to perform a TDDB and a BTI test on a device substantially simultaneously. FIG. 8 illustrates three graphs (802, 804, and 806). Graph 802 plots a stress voltage signal 830 applied to the gate of a transistor with respect to time. In one embodiment, the voltage signal 830 may be a VRS signal. However, other types of signal may be used and remain within the spirit and scope of the present invention. Graph 802 plots a stress voltage signal 830 applied to a node on a circuit, e.g., to the gate of a transistor, with respect to time. Graph 804 illustrates the corresponding drain voltage ($V_D$) during that time. Graph 802 shows a voltage signal applied to a circuit node, e.g., the gate, in a step-wise manner, increasing up to the pre-step 810 level. Prior to starting the stress voltage, a reference drain current ($I_{Id}$) and a reference gate current ($I_{Ig}$) are measured. These reference currents may be compared to actual sensed currents in order to check the threshold integrity. The example of FIG. 8 illustrates that, in one embodiment, the test based on $I_{Id}$ and $I_{Ig}$ may be performed prior to the voltage ramp stress test (i.e., prior to $t_{start}$). In an alternative embodiment, the test based upon $I_{Id}$ and $I_{Ig}$ may be a test that is separate from the voltage ramp stress test. In yet another alternative embodiment, $I_{Id}$ and $I_{Ig}$ may be measured subsequent to the voltage ramp stress test for analysis/testing.

Graph 804 relates to sensing linear voltages and currents. For example, when the linear drain current. $I_{dlin}$, and the linear voltage threshold. $V_{Tlin}$, are sensed, the drain voltage $V_D$ (or source voltage ($V_S$)), may be held at a low voltage, such as 50 mV, as illustrated in Graph 804. Moreover, Graph 806 relates to sensing saturation voltages and currents. When the saturation voltage threshold, $V_{Tsat}$, and the saturation drain current, $I_{dsat}$, are sensed, during the stress portion, the drain voltage, $V_D$ (or source voltage ($V_S$)), may be held at a first, low voltage ($V_1$). e.g., at 50 mV, as illustrated in Graph 806. However, during the sense portion (of sensing the saturation current/voltage), $V_D$, may move to a higher, second voltage ($V_2$). e.g., $V_{DD}$ voltage level.

Substantially simultaneously to performing a BTI analysis, signal 830 contains intermediate monitoring steps for verification of dielectric breakdown as well. The steps in the voltage signal 830 are characterized by a change in voltage of $\Delta V$ (step 830) during a time period of $\Delta T$ ($t_{stress}$ 840). In one example, the sense time ($t_{sense}$) 850 may be 2 msec. The dielectric breakdown may be determined from monitoring current or stress current versus stress voltage traces during at least a portion of the sense time ($t_{sense}$) 850. In one example, the sense time ($t_{sense}$) 850 may be 2 msec. As indicated in FIG. 8, the stress voltage signal 830 is ramped up in steps 820. In some embodiments, the steps 820 may be of 15 mV, whereas in other embodiments, the steps 820 may be of 50 mV. In an alternative embodiment, monitoring for TDDB may not be required and can be obtained from stress current itself.

Figure 8:
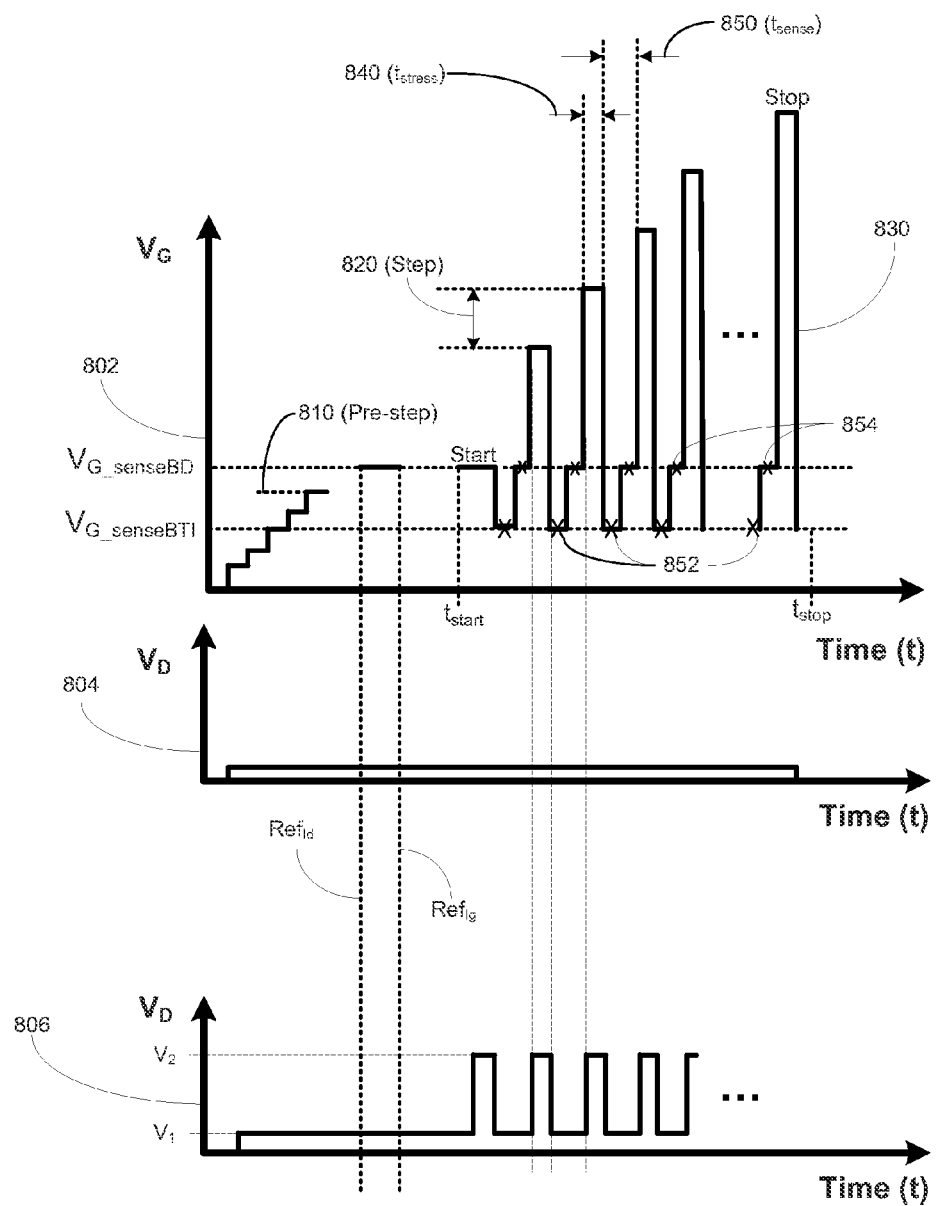
FIG. 8 depicts an exemplary signal for performing a voltage breakdown and threshold integrity test, in accordance with some embodiments herein.

The voltage signal 830 depicted in FIG. 8 provides for a dual intermittent sense feature for sensing electrical parameters for performing a TDDB analysis as well as a BTI analysis. The sense time ($t_{sense}$) 850 of the signal 830 provides for dual sensing: one for TDDB sensing and the other for BTI sensing. The sense time ($t_{sense}$) 850 has two components: a TDDB sense component, as denoted by the crosshairs 854; and a BTI sense component, as denoted by the crosshairs 852. As shown in FIG. 8, the sensing function for the TDDB sensing is performed when the signal reaches the crosshairs 854 at the voltage level gate sense voltage $V_{G\_senseBD}$. The sensing function for the BTI sensing is performed when the signal reaches the crosshairs 852 at the voltage level gate sense voltage $V_{G\_senseBTI}$. Although the example of FIG. 8 indicates that the BTI sense component 852 occurs slightly prior to the TDDB sense component 854 during the substantially simultaneous sensing, those skilled in the art having benefit of the present disclosure would appreciate that the vice versa may apply and remain within the spirit and scope of the present disclosure. That is, the order to the BTI sense and the TDDB sense (crosshairs 852 and 854) are interchangeable are remain within the spirit and scope of the present disclosure.

At the start time $t_{start}$, a stress voltage is provided to a node of the device (e.g., the gate of a transistor), wherein the value of the stress voltage is below, above, or at the TDDB gate sense voltage $V_{G\_senseBD}$ and above the BTI gate sense voltage $V_{G\_senseBTI}$. For example, during testing, the gate of a transistor may be connected to the signal 830, while the source and drain terminals of the transistor are held at ground. During the stress condition, $t_{stress}$ 840, the gate is provided a voltage of a value that is greater than $V_{G\_senseBTI}$ and $V_{G\_senseBD}$. Following a rise in the value of the stress voltage signal 830 during a stress time period $t_{stress}$ 840, during the subsequent sensing time period $t_{sense}$ 850, the level of the stress voltage is brought back down to the BTI gate sense voltage ($V_{G\_senseBTI}$) level for performing a BTI sensing function. At this time (crosshair 852), a BTI sensing function is performed. In one example, at the crosshair 852, the $V_{G\_senseBTI}$ may be the normal threshold gate voltage $V_T$ (e.g., 0.4-0.5 Volts). In one embodiment, the drain current, $I_d$, may then be measured. Using knowledge of the impedance of the circuit portion in light of the known dimensions, the test threshold voltage is calculated (based upon the impedance and $I_d$). This calculated threshold voltage may provide an indication of the voltage threshold ($V_T$) shift that has occurred due to the stress voltage 830. Moreover, the BTI test may be performed at one or more elevated temperatures, such as 125° C. Similarly, the linear drain current ($I_{dlin}$), where the drain is trying to turn on, $I_{dsat}$, relating to the "on" current measurement may be measured, and linear voltage threshold, $V_{Tlin}$, and saturation voltage threshold, $V_{Tsat}$, are determined. The shift in the parameters $I_{dlin}$, $I_{dsat}$, $V_{Tlin}$, and $V_{Tsat}$, may be used to characterize the reliability of the device under test.

Continuing referring to FIG. 8, subsequent to the BTI sensing at crosshair 852, within the same sensing time period $t_{sense}$ 850, the level of the stress voltage is brought back up to the TDDB gate sense voltage $V_{G\_senseBD}$. In some examples, the $V_{G\_senseBD}$ may be equivalent to $V_{DD}$. In other embodiments, the $V_{G\_senseBD}$ may be equivalent to the normal use voltage $V_{use}$, of a particular application. The normal use voltage $V_{use}$ may refer to the voltage level that may be provided during the particular intended use of the device. At this time (crosshair 854), a TDDB sensing function is performed. The TDDB test may be performed at one or more elevated temperatures, such as 125° C. After applying stress voltage to the gate of the transistor, during the TDDB sensing portion of the sense time ($t_{sense}$) 850 (i.e., at crosshair 854), other portions of the transistor, e.g., drain current $I_d$, may be examined for detecting shifts that may be indicative of breakdown of a portion of the circuit under test. This process may be repeated, as indicated by the pulse train of FIG. 8. The example provided herein indicates that the BTI sensing portion of sense time ($t_{sense}$) 850 occurs prior to the TDDB sensing portion. However, those skilled in the art having benefit of the present disclosure would appreciate that the reverse may also be performed and remain within the spirit and scope of the present embodiments. Those skilled in the art having benefit of the present disclosure would appreciate that within the context of the pulse train signal 830, the BTI and the TDDB tests are performed during the sense time ($t_{sense}$) 850 intervals. Thus, the TDDB stress and sense functions are performed substantially simultaneously, or together, with the BTI stress and sense functions, upon the same device. Based upon performing the stress and sense functions, the shift in the threshold voltage of a transistor, as well as the breakdown characteristic of the device (e.g., gate integrity at which point the dielectric fails), may be determined.

Continuing referring simultaneously to FIGS. 7 and 8, upon performing the BTI-TDDB tests, data relating to the tests are sensed (block 724). The BTI-TDDB test data for each device that is tested may be processed and/or stored for further analysis. A determination may then be made as to whether the effects the processes had on the reliability of the integrated circuits are acceptable, based upon the BTI-TDDB tests (block 730). Upon a determination that the effects that the processes had upon the reliability of the integrated circuits are not acceptable based upon the tests, one or more modifications to process parameters may be made in order to adjust the process steps that are performed when manufacturing the integrated circuits (block 740). Upon modifying process parameters, additional integrated circuits may be formed on substrates and subsequent BTI-TDDB tests may be performed, as indicated in FIG. 7.

Upon a determination that the effects of processing upon the reliability of the integrated circuits are acceptable based upon the BTI-TDDB tests, a certification may be made that the test results are acceptable (block 750). Based upon this certification, manufacturing of the integrated circuits of the existing process parameters may be continued (block 760).

Figure 9:
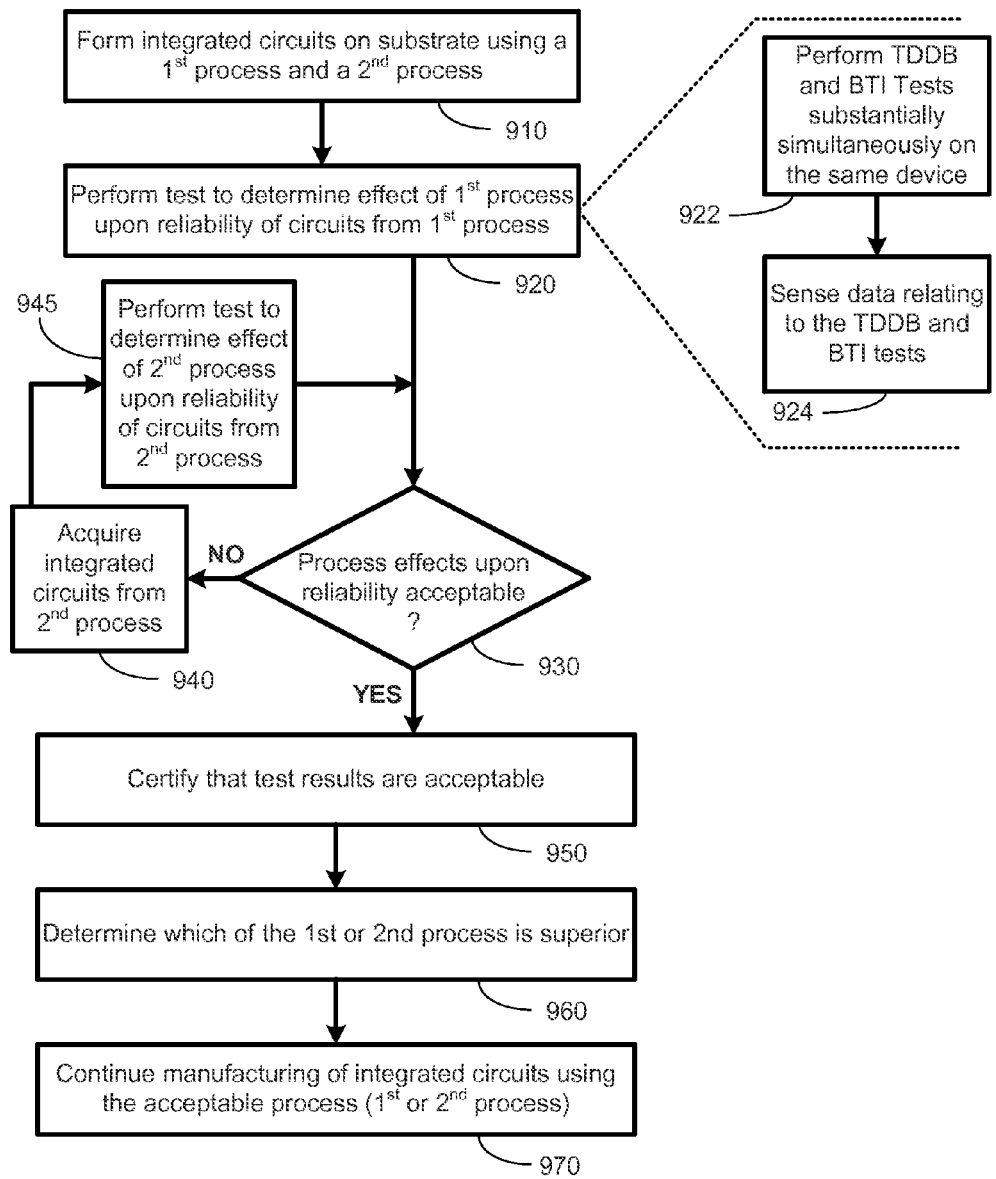
FIG. 9 depicts illustrates a flowchart depiction of a process flow for manufacturing and testing semiconductor devices, in accordance with some alternative embodiments herein.

FIG. 9 illustrates a flowchart depiction of process flow for manufacturing and testing semiconductor devices, in accordance with an alternative embodiment herein. Integrated circuits/devices are formed on substrates using at least a first semiconductor manufacturing process and a second manufacturing process (block 910). Various separate processes are performed on semiconductor substrates in manufacturing integrated circuit products. For example, each of the first and second manufacturing processes may contain its own corresponding photolithography process, etching process, CMP process, etc., to provide a first set of integrated circuits/devices and a second set of integrated circuits/devices.

At least a portion of the first set of devices may be tested in order to determine the effects of processes upon the reliability of devices (block 920). In many cases the, TDDB and BTI tests are be performed substantially simultaneously on the first set of devices. In an alternative embodiment, TDDB and BTI tests may be performed substantially simultaneously on the second set of devices for comparison.

Embodiments herein provide for the TDDB and BTI tests to be performed together on a single device from the first process (block 922). Upon performing the BTI-TDDB tests, data relating to the tests are sensed (block 924). The BTI-TDDB test data for each device that is tested may be processed, correlated to the first or second processes, and/or stored for further analysis. A determination may then be made as to whether the effects the processes had on the reliability of the devices from the first process are acceptable, based upon the BTI-TDDB tests (block 930).

In one embodiment, upon a determination that the effects that the processes had upon the reliability of the devices from the first process not acceptable based upon the tests, devices from the second processes may be acquired (block 940). The BTI-TDDB tests may then be performed on at least one device from the second process to determine the device(s) (block 945). A determination may then be made as to whether the effects the processes had on the reliability of the devices from the second process are acceptable, based upon the BTI-TDDB tests.

Upon a determination that the effects of processing upon the reliability of the devices are acceptable based upon the BTI-TDDB tests, a certification may be made that the test results are acceptable (block 950). Further, a determination may be made as to which of the processes (first process or second process) is superior as to the reliability of their respective devices (block 960). Based upon the certification and the determination of reliability superiority, manufacturing of devices/integrated circuits using either the first or second process may be performed (block 770). Those skilled in the art would appreciate that a greater number of process steps may be similarly compared for selecting more reliable devices/integrated circuits.

Utilizing embodiment herein, a more efficient learning cycle is made possible, wherein device reliability is tested in a more streamlined fashion for faster feedback for process selection or adjustments. The substantially simultaneous BTI-TDDB testing provides faster results. Further, due to the substantially simultaneous of BTI-TDDB testing on the same device, testing data relating to each of the BTI test and the TDDB test may be cross-correlated for more accurate analysis and feedback adjustment of process parameters. Embodiments herein provide for performing substantially simultaneous single BTI-TDDB testing of NMOS and/or PMOS devices in such a manner that test data from both the failure mechanisms may be collected on the same device during the test. This may allow for substantially reduced (e.g., one-half) testing time.

Further, performing the single BTI-TDDB testing described herein provides for using less testing resources and reducing the number of devices (e.g., by one-half). Alternatively, the same amount of BTI-TDDB testing may be performed while providing for higher statistical data collection. Embodiments herein provide for more robust, cross-correlated data from two testing mechanisms at the same time for the same device, which may provide for more accurate assessment of the reliability of devices and the causes of the reliability issues. The feedback information regarding the reliability of devices made from various process sets may be used to more efficiently perform process splits between various process sets. This may in turn provide for more accurate and efficient technology development and/or production.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
providing a device having at least one transistor and at least one dielectric layer;
providing a test signal for performing a time-dependent dielectric breakdown (TDDB) test and a bias temperature instability (BTI) test on said device;
performing said TDDB test and said BTI test on said device based upon said test signal; and
performing at least one of acquiring, storing, or transmitting data relating to a breakdown of said dielectric layer and at least one characteristic of said transistor based upon said TDDB test and said BTI test.

2. The method of claim 1, wherein providing said test signal comprises providing a voltage ramp signal comprising a first voltage level during a first stress time period, a second voltage level during a BTI sense time period, a third voltage level during a TDDB sense time period, and a fourth voltage level during a second stress time period, wherein said fourth voltage level is higher than said first voltage level by a ramp-step value.

3. The method of claim 2, wherein performing said TDDB test and said BTI test comprises performing a TDDB sensing function during said TDDB sense time period, and a BTI sensing function during said BTI sense time period.

4. The method of claim 2, wherein said second voltage level during said BTI sense time period is a gate threshold voltage level of said transistor, and wherein said third voltage level during said TDDB sense time period is at least one of a supply voltage level or an intended-use voltage level.

5. The method of claim 1, wherein performing said TDDB test and said BTI test substantially simultaneously comprises determining at least one of a linear drain current, a saturation drain current, a linear gate threshold voltage, or a saturation gate threshold voltage of said transistor.

6. The method of claim 5, wherein determining said saturation gate threshold voltage comprises determining a gate threshold voltage based upon said saturation drain current and an impedance of a portion of said transistor, and wherein determining said linear gate threshold voltage comprises determining said linear gate threshold voltage based upon said linear drain current and said impedance of said portion of said transistor.

7. The method of claim 6, wherein said impedance is based upon a geometry of said portion of said transistor.

8. The method of claim 1, wherein said device is comprised of at least one of said transistor, a capacitor, a resistor, memory cell, a CMOS device, a BiCMOS device, a Flash device, a DRAM memory device, and a power device.

9. The method of claim 1, wherein said device is said transistor and said dielectric layer is a gate insulation layer for said transistor.

10. The method of claim 1, wherein said dielectric layer is an inter-level or intra-level dielectric layer of a semiconductor device.

11. The method of claim 1, wherein performing said TDDB test and said BTI test comprises performing said TDDB test and said BTI test at a predetermined temperature.

12. The method of claim 1, further comprising modifying at least one process parameter based upon said TDDB test and said BTI test comprises modifying at least one of a temperature, a pressure, a duration, a process gas composition, a process gas concentration, and an applied voltage of a process operation.

13. A system, comprising:
a semiconductor device processing system to provide a device comprising at least one transistor and at least one dielectric layer;
a processing controller operatively coupled to said semiconductor device processing system, said processing controller configured to control an operation of said semiconductor device processing system; and
a testing module for providing a voltage ramp signal (VRS) test signal for performing a bias temperature instability (BTI) and a time-dependent dielectric breakdown (TDDB) test on said device and provide data relating to a breakdown of said dielectric layer and at least one characteristic of said transistor based upon said BTI test and said TDDB test.

14. The system of claim 13, wherein said processing controller is configured to modify at least one process parameter based upon said data relating to the breakdown of said dielectric layer and at least one characteristic of said transistor.

15. The system of claim 13, further comprising:
a testing controller operatively coupled to said testing module, said testing controller configured to control an operation of said testing module; and
a test data analysis unit to perform an analysis of said data relating to the breakdown of said dielectric layer and at least one characteristic of said transistor, said test data analysis unit to provide analysis data to said processing controller for modifying at least one process parameter.

16. The system of claim 13, wherein said VRS test signal comprises a plurality of pulse cycles, wherein each pulse cycle comprises a stress time period and a sense time period, wherein said stress time period comprises a pulse that progressively rises in each subsequent cycle and wherein said sense time period comprises a TDDB sense period and a BTI sense period.

17. The system of claim 16, wherein the value of the VRS test signal during said TDDB sense period is at least one of a supply voltage level or an intended-use voltage level, and wherein said value of said VRS test signal during said BTI sense period is a gate threshold voltage level of said transistor.

18. The system of claim 16, wherein said testing module comprises:
a pulse generator for generating said VRS test signal;
a measurement tool to measure at least one of a linear drain current, a saturation drain current, a gate threshold voltage, or a linear gate threshold voltage of said transistor;
a switch to change from said stress mode to said sensor mode; and
a controller to control an operation of at least one of said pulse generator, said measurement tool, and said switch.

19. A method, comprising:
receiving a first device having at least one transistor and a dielectric layer for testing;
providing a test signal for performing a time-dependent dielectric breakdown (TDDB) test and a bias temperature instability (BTI) test onto the gate of said transistor, wherein said test signal comprises a plurality of pulse cycles, wherein each pulse cycle comprises a stress time period and a sense time period, wherein said stress time period comprises a pulse that progressively rises in each subsequent cycle and wherein said sense time period comprises a TDDB sense period and a BTI sense period;
performing said TDDB test and said BTI test on said device by performing sensing functions during said TDDB and BTI sense periods for providing data relating to a breakdown of said dielectric layer and at least one characteristic of said transistor based upon said TDDB test and said BTI test; and
modifying at least one process parameter based upon said data.

20. The method of claim 19, wherein performing said TDDB test and said BTI test comprises determining at least one of a linear drain current, a saturation drain current, a saturation gate threshold voltage, or a linear gate threshold voltage of said transistor.

* * * * *